United States Patent [19]

Zisa et al.

[11] Patent Number: 5,010,439
[45] Date of Patent: Apr. 23, 1991

[54] CONTROL CIRCUIT FOR THE CLAMPING VOLTAGE OF AN INDUCTIVE LOAD DRIVEN BY A POWER DEVICE IN A HIGH SIDE DRIVER CONFIGURATION

[75] Inventors: Michele Zisa, Comiso; Sergio Palara, Acicastello, both of Italy

[73] Assignee: SGS-Thomson Microelectronics s.r.l., Milano, Italy

[21] Appl. No.: 364,174

[22] Filed: Jun. 12, 1989

[30] Foreign Application Priority Data

Jul. 29, 1988 [IT] Italy .................................. 21561 A/88

[51] Int. Cl.⁵ .......................... H02H 7/20; H03K 17/60
[52] U.S. Cl. ...................................... 361/91; 307/542; 307/584; 361/111
[58] Field of Search .......................... 323/282, 351, 284; 363/56; 361/91, 111; 307/540, 542, 567, 300, 571, 584

[56] References Cited

U.S. PATENT DOCUMENTS

| | | | |
|---|---|---|---|
| 4,549,095 | 10/1985 | Stefani et al. | 307/300 |
| 4,602,209 | 7/1986 | Williams et al. | 323/351 |
| 4,665,459 | 5/1987 | Bynum et al. | 361/111 |
| 4,679,112 | 7/1987 | Craig | 361/111 |
| 4,728,826 | 3/1988 | Einzinger et al. | 307/542 |

Primary Examiner—William H. Beha, Jr.
Attorney, Agent, or Firm—Sixbey, Friedman, Leedom & Ferguson

[57] ABSTRACT

The power device has a power supply terminal, a load terminal connected to earth by means of an inductive load and a control terminal connected to a circuit with inlet for an alternating control signal. Whenever the power device is turned off, a switching element hitches the voltage of the control terminal to that of the load terminal, which is forced to fall by the inductive load. There is provided a discharge circuit of the inductive load, which includes means having a predetermined threshold which are fired when the voltage of the load terminal falls down to said predetermined threshold.

3 Claims, 1 Drawing Sheet

CONTROL CIRCUIT FOR THE CLAMPING VOLTAGE OF AN INDUCTIVE LOAD DRIVEN BY A POWER DEVICE IN A HIGH SIDE DRIVER CONFIGURATION

DESCRIPTION

The present invention relates to a control circuit for the clamping voltage of an inductive load drive by a power device in a high side driver configuration.

The latter expression means the arrangement of the power device between the power supply and the inductive load, in turn connected to earth. This is a very typical arrangememt in the industrial field, for example for purpose of driving motors and of controlling deflector circuits for television sets.

Such a configuration provides that the drive of the power device, be it an MOS transistor or a bipolar transistor or a Darlington circuit or whatever, be carried out by means of an alternating control signal, which operates in combination with a shut-down signal earthing the control terminal of the power device. The low levels of the control signal determine the shut-down of the power device, whose load terminal connected to the inductive load is thus made to fall from the latter until a voltage, called clamping voltage, is reached which determines the activation of a discharge circuit of the inductive load, either by turning the power device on again or by means of a separate recycling diode.

This known system has the drawback that its clamping, and thus its discharge, voltage is relatively low in absolute terms, on which a proportionally high discharge time depends.

The object of the present invention is to increase the clamping voltage in absolute value and thus to reduce the discharge time of the inductive load.

A further object of the present invention is to make the above clamping voltage adjustable.

According to the invention such objects are attained with a control circuit for the clamping voltage of an inductive load driven by a power device having a power supply terminal, a load terminal connected to earth through the inductive load and a control terminal connected to an alternating control signal input, there being provided a discharge circuit for the inductive load which is activated when said clamping voltage is attained, characterized in that it includes a switching element connected between said control terminal and said load terminal and having a control element connected to a voltage supply by first switching means operating in push-pull with second switching means connected between said control terminal and said control signal input and at the latter's same frequency, so as to accomplish a direct connection between said control terminal and said load terminal whenever the power device is shut down, said discharge circuit including means having a predetermined firing threshold which are activated when the voltage at the load terminal of the power device falls below earth until it reaches said firing threshold.

Said in other words, the control circuit according to the invention is based on the fact that, during the power device's shut-down, it hitches the voltage of the control electrode to that of the load electrode, which is in turn forced to fall below earth by the inductive load connected to earth. In this way the power device does not turn on again and the voltage of the load electrode can continue to fall below earth until it reaches the firing threshold of the threshold means inserted in the discharge circuit. Such threshold represents the clamping voltage of the inductive load and can suitably be made very high in absolute value and adjustable.

Some examples of an embodiment of the present invention are illustrated for greater clarity in the enclosed drawings, wherein.

Figure 1:
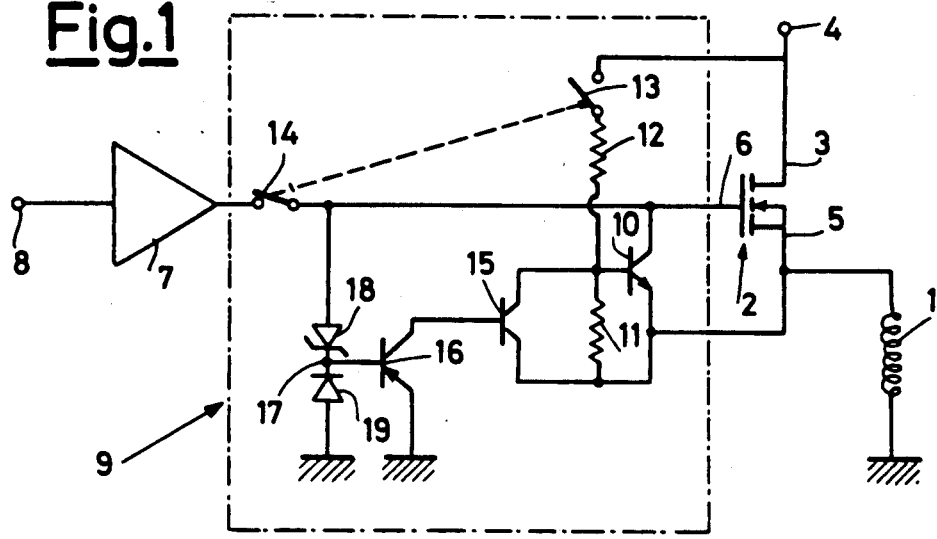
FIG. 1 shows a first embodiment of the control circuit according to the invention.

FIG. 1 shows an inductive load 1, schematically represented by an inductance, which is driven by a power device 2 constituted by way of an example by an MOS power transistor having a power supply terminal or drain 3 connected to a positive power supply 4, a load terminal or source 5 connected to earth by means of the inductance 1 and a control terminal or gate 6 connected by means of a control amplifier 7 to an inlet 8 for an alternating control signal. The configuration described, with the power device 2 on the high or power supply side with respect to the inductive load 1, is commonly called a high side driver.

Between the control terminal 6 of the power device 2 and the control amplifier 7 there is connected a control circuit 9 according to the present invention, which can be completely integrated in a monolithic structure indicated by a dotted line in FIG. 1.

The above control circuit 9 comprises a switching element 10, constituted by an NPN transistor, connected between the gate 6 and the source 5 of the MOS power transistor 2. The base of the transistor 10 is connected to the emitter of the same transistor by means of a resistance 11 and it is also connected to the power supply 4 by means of a resistance 12 and a first switch 13 operated (by suitable and in themselves known means) in push-pull with a second switch 14 connected between the amplifier 7 and the gate 6 of the power MOS 2 at the same frequency of the control signal applied to the input 8, so that the switch 13 is open and the switch 14 is closed when the control signal is at a high level, and vice versa when said signal is at a low level.

In parallel with the resistance 11 there is an NPN transistor 15, whose base is connected to the collector of a PNP transistor 16, which has the emitter connected to earth and the base connected to a junction point 17 between a Zener diode 18 and a diode 19 connected in series between the gate 6 of the MOS transistor 2 and earth.

(1) When the control signal at the input 8 is high, the switch 14 is closed, the switch 13 is open and the power MOS transistor 2 is on and charges the inductance 1.

(2) When the control signal becomes low, the switch 14 opens and, simultaneously, the switch 13 closes. The closure of the switch 13 causes current from the supply 4 to pass through the resistance 12 and 11 and into the base of the transistor 10, which is fired. The transistor 10 when fired puts the gate and source terminals 6 and 5 of the power MOS transistor 2 at the same voltage (except for the saturation collector-emitter voltage of the transistor 10), thereby discharging the gate-source capacity Cgs of the power MOS 2 and causing the switching-off of the same power MOS 2.

(3) The switching-off of the power MOS causes the interruption of the passage of current through the power MOS; as a consequence (according to the law V=L dI/dt for the inductance 1) a negative voltage is generated at the source 5 of the power MOS 2.

(4) The negative voltage on the gate 6 of the power MOS 2 is also present on the anode of the zener diode 18, the firing voltage of which is predetermined. As a consequence, there is no passage of current through the zener diode 18 and the diode 19 until a voltage equal to the firing voltage of the zener 18 plus the base-emitter voltage of the diode 19 is reached at their ends.

(5) As soon as the zener diode 18 is fired, a passage of current of capacitive type is caused from ground (which is the point to the gate 6 of the power MOS 2 which is the point at lower voltage). The current is of capacitive type, since the firing of the base-emitter junction of the transistor 16, which is simultaneous with the firing of the diode 19 (as the transistor 16 and the diode 19 are in "current mirror" configuration), causes the firing of the same transistor 16 and of the transistor 15; as a consequence, the base and the emitter of the transistor 10 will be short-circuited, thereby causing the switching-off of the transistor 10 and the consequent removal of the short-circuit connection between the gate and source terminals of the power MOS 2, so that the normal capacity between the gate 6 and the source 5 of the power MOS 2 is restored and begins to charge.

(6) While the gate 6 of the power MOS 2 remains at the negative voltage fixed by the firing of the zener 18 and the diode 19, the voltage of the source 5 of the power MOS 2 further decreases to a threshold value which causes refiring of the power MOS 2. When the power MOS 2 is fired again, current passes through the same and the energy stored in the inductance discharges through the power MOS. Once the discharge is finished the source voltage of the power MOS 2 returns to zero, thereby switching-off the transistor 15. The switching-off of the transistor 15 results from the fact that, when the source 5 goes to zero, the gate-source capacity charges and the gate 6 therefore goes to a positive voltage. As a consequence, the passage of current in the circuit branch 18-19 is interrupted since the diode 19 is reversely biased. Therefore, the transistor 16 is switched-off and feeds no longer the base of the transistor 15, which switches off. As a consequence, the transistor 10 fires again, thereby putting to ground the voltage at the gate 6 of the power MOS 2 (except for the saturation collector-emitter voltage of the transistor 10).

By suitably selecting the firing voltage of the Zenar diode 18, on which the turn-on voltage of the power device depends, it is possible to arrange that the voltage at which the discharge of the inductance 1 occurs is very high at its ends, that is higher in absolute value than that according to the known art ($-15$ to $-30V$ against $-3$ to $-4V$ with respect to earth), so that the discharge time is very brief.

Such discharge voltage may be varied easily by changing the Zener diode 18, taking the only precaution of remaining below the breakdown voltage of the power device. In such a way it is also possible to adjust the discharge time.

Figure 2:
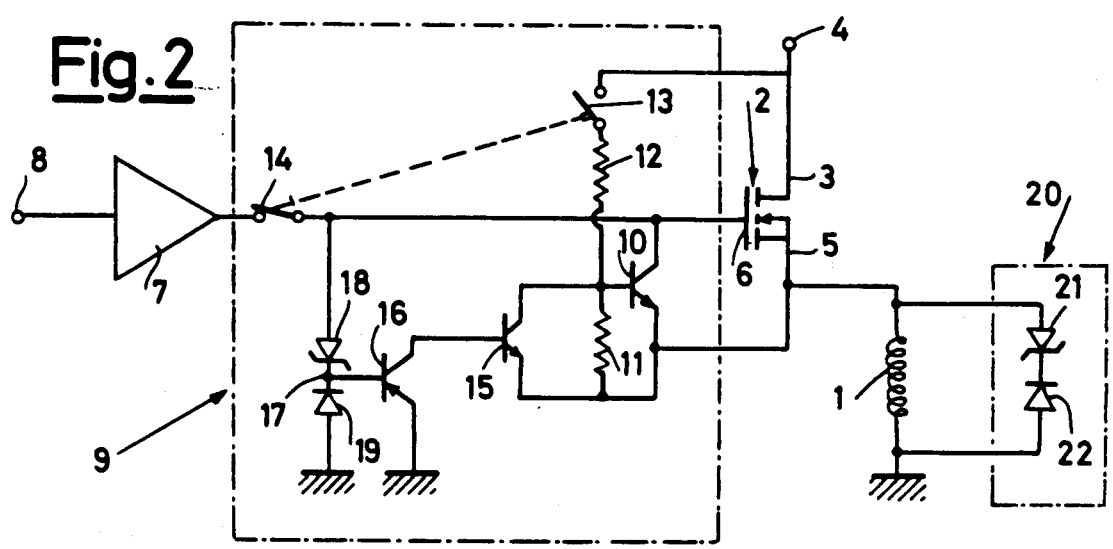
FIG. 2 shows a second embodiment of the control circuit according to the invention.

FIG. 2 shows a variant of the control circuit of FIG. 1, whereby it is possible to avoid the discharge of the inductance through the power device 2. Such discharge does in fact imply a considerable dissipation inside the power device itself, which is subjected to a voltage equal to the power supply voltage added to that to which the source 5 is taken with respect to earth and at the same time it is passed through by a high current due to the discharge of the inductance 1.

According to FIG. 2 the discharge of the inductance 1 through the power device 2 is avoided by adding to the control circuit 9 a part 20, external or which can in turn be integrated, constituted by the series of a Zener diode 21 and a diode 22, connected in parallel with the inductance 1.

For the discharge of the inductance to occur through the diodes 21 and 22 the condition must be satisfied that the sum of the direct voltage of the diode 19, the threshold voltage of the Zener diode 18 and the threshold voltage of the MOS power transistor 2 be higher than the sum of the voltages of the diode 22 and of the Zener diode 21. If this condition is satisfied, the diodes 21 and 22 are turned on earlier than the MOS power transistor 2 and the inductance 1 is thus discharged through diodes 21 and 22 rather than through the power device.

In the case of FIG. 2 the presence of components 15, 16, 18 and 19 is not strictly necessary as long as the condition is satisfied that the sum of the power supply voltage at terminal 4, of the voltage of Zener diode 31 and of the direct voltage of diode 22 is lower than the breakdown voltage of the power device, so as to avoid the latter's breakdown.

In such a case, the above components 15, 16, 18 and 19 take on a safety function for the power device and will trip should diodes 21 and 22 not be turned on. The reignition of the MOS transistor 2 follows the discharge on the diodes 21 and 22 but is controlled by the switch 13.

Figure 3:
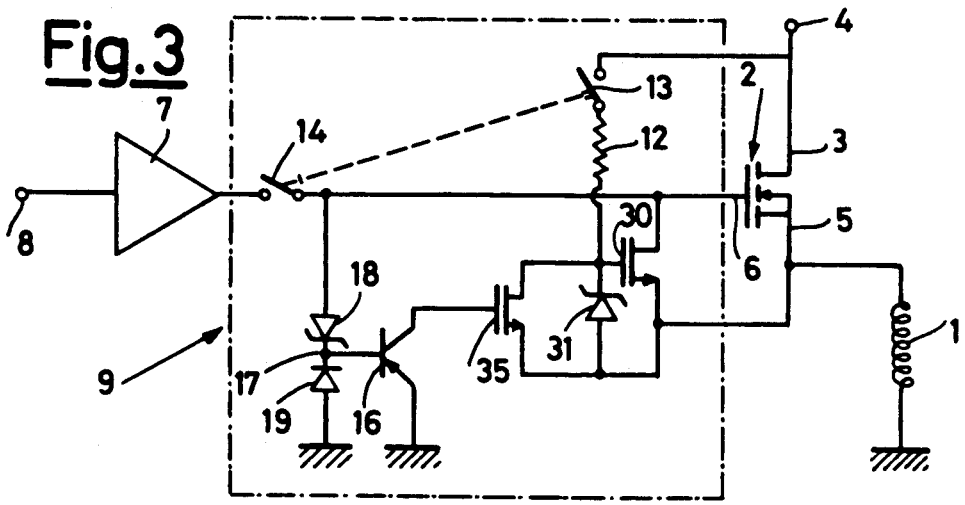
FIG. 3 shows a third embodiment of the control circuit according to the invention.

In FIG. 3 there is illustrated a further variant of the circuit of FIG. 1, wherein the bipolar transistors 10 and 15 have been replaced with MOS transistors 30 and 35 and the resistance 11 has been suitably replaced with a Zener diode 31 protecting the MOS 30 gate.

Other variants may be thought up by a technician without going outside the scope of the invention as defined by the claims which follow. In particular, it should be noted that, even if in the embodiments illustrated by way of an example in the drawings the power device has been seen in the forms of MOS transistors, the invention is still usable without any conceptual modifications even with other power devices such as bipolar transistors, HIMOS's, Darlington circuits.

I claim:

1. Control circuit for the clamping voltage of an inductive load driven by a power device having a power supply terminal, a load terminal connected to earth through the inductive load and a control terminal connected to an alternating control signal input, there being provided a discharge circuit for the inductive load which is activated when said clamping voltage is attained, characterized in that it includes a switching element connected between said control terminal and said load terminal and having a control element connected to a voltage supply by first switching means operating in push-pull with second switching means connected between said control terminal and said control signal input and at the latter's same frequency so as to accomplish a direct connection between said control terminal and said load terminal whenever the power device is shut down, said discharge circuit including threshold means having a predetermined firing threshold which are activated when the voltage at the load terminal of the power device falls below earth until it reaches said firing threshold where said threshold means are constituted by a Zener diode connected between said control terminal of the power device and earth by a diode, there being provided means sensitive to the firing of said Zener diode to control the deactivation of said switching element for the subsequent turning on of said power device.

2. Control circuit according to claim 1, characterized in that said switching element is constituted by a bipolar transistor.

3. Control circuit according to claim 1, characterized in that said switching element is constituted by an MOS transistor.

* * * * *

UNITED STATES PATENT AND TRADEMARK OFFICE
CERTIFICATE OF CORRECTION

PATENT NO. : 5,010,439

DATED : April 23, 1991

INVENTOR(S) : Michele Zisa et al.

It is certified that error appears in the above-identified patent and that said Letters Patent is hereby corrected as shown below:

On the title page, item [73] should read as follows:
--[73] Assignee: SGS-Thomson Microelectronics s.r.l.
Agrate Brianza, Milano, Italy --.

Signed and Sealed this

Eighth Day of December, 1992

Attest:

DOUGLAS B. COMER

*Attesting Officer*  *Acting Commissioner of Patents and Trademarks*